(12) United States Patent
Cao (10) Patent No.: US 12,278,107 B2
(45) Date of Patent: Apr. 15, 2025

(54) SEMICONDUCTOR STRUCTURE AND METHOD FOR FORMING SEMICONDUCTOR STRUCTURE (71) Applicant: CHANGXIN MEMORY TECHNOLOGIES, INC., Hefei (CN)

(72) Inventor: Kai Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 508 days.

(21) Appl. No.: 17/676,293

(22) Filed: Feb. 21, 2022

(65) Prior Publication Data

US 2022/0301871 A1 Sep. 22, 2022

Related U.S. Application Data

(63) Continuation of application No. PCT/CN2021/120121, filed on Sep. 24, 2021.

(30) Foreign Application Priority Data

Mar. 18, 2021 (CN) .......................... 202110289168.9

(51) Int. Cl.
*H01L 21/033* (2006.01)
*H01L 21/311* (2006.01)
*H01L 21/768* (2006.01)

(52) U.S. Cl.
CPC ...... *H01L 21/0332* (2013.01); *H01L 21/0337* (2013.01); *H01L 21/31144* (2013.01); *H01L 21/76811* (2013.01)

(58) Field of Classification Search
CPC ............. H01L 21/0332; H01L 21/0337; H01L 21/31144; H01L 21/76811
See application file for complete search history.

(56) References Cited

U.S. PATENT DOCUMENTS

| 7,153,778 B2 | 12/2006 | Busch |
| 7,321,149 B2 | 1/2008 | Busch |

(Continued)

FOREIGN PATENT DOCUMENTS

| CN | 108155149 A | 6/2018 |
| CN | 110634733 A | 12/2019 |

(Continued)

OTHER PUBLICATIONS

Supplementary European Search Report in the European application No. 21931178.4, mailed on Nov. 15, 2023, 7 pages.

*Primary Examiner* — Michael Lebentritt
(74) *Attorney, Agent, or Firm* — Kilpatrick Townsend & Stockton LLP (57) ABSTRACT

A semiconductor structure and a method for forming a semiconductor structure are provided. The method for forming the semiconductor structure includes: providing a base; forming a first dielectric layer on the base; then forming a plurality of first mask patterns each having zigzag shape on the first dielectric layer, in which the first mask patterns extend in a first direction; forming a plurality of second mask patterns each having zigzag shape on the first mask patterns, in which the second mask patterns extend in a second direction different from the first direction, and projections of the first mask patterns on the first dielectric layer and projections of the second mask patterns on the first dielectric layer overlap with each other to form polygons; and etching the first dielectric layer by using the second mask patterns and the first mask patterns as masks to form openings.

18 Claims, 10 Drawing Sheets

(56) References Cited

U.S. PATENT DOCUMENTS

| | | |
|---|---|---|
| 7,538,036 B2 | 5/2009 | Busch |
| 2005/0186802 A1 | 8/2005 | Busch |
| 2005/0269620 A1 | 12/2005 | Busch |
| 2006/0009042 A1 | 1/2006 | Busch |
| 2006/0024907 A1 | 2/2006 | Wilson |
| 2013/0094035 A1* | 4/2013 | Chang ................ H01L 27/0207 |
| | | 358/1.9 |
| 2013/0260562 A1 | 10/2013 | Park et al. |
| 2014/0162461 A1 | 6/2014 | Kim |
| 2016/0027787 A1 | 1/2016 | Park |
| 2016/0070838 A1* | 3/2016 | Kang .................... G06F 30/398 |
| | | 716/55 |
| 2017/0371250 A1* | 12/2017 | Kim .......................... G03F 1/44 |
| 2019/0164772 A1* | 5/2019 | Tseng ................ H01L 21/76885 |
| 2020/0006078 A1* | 1/2020 | Liu .................... H01J 37/32623 |
| 2020/0219732 A1 | 7/2020 | Lee |
| 2022/0085181 A1* | 3/2022 | Yin .................... H01L 29/42344 |
| 2023/0034701 A1* | 2/2023 | Lee ........................ H01L 28/86 |
| 2023/0062234 A1* | 3/2023 | Tu ..................... H01L 21/76802 |

FOREIGN PATENT DOCUMENTS

| | | | | |
|---|---|---|---|---|
| CN | 111199875 A | | 5/2020 | |
| CN | 111524795 A | | 8/2020 | |
| CN | 111640705 A | | 9/2020 | |
| CN | 112349588 A | | 2/2021 | |
| JP | 2017076795 A | * | 4/2017 | ........... H01L 23/642 |
| KR | 100594326 B1 | * | 3/2005 | |
| KR | 101883327 B1 | | 7/2018 | |

\* cited by examiner

SEMICONDUCTOR STRUCTURE AND METHOD FOR FORMING SEMICONDUCTOR STRUCTURE

CROSS-REFERENCE TO RELATED APPLICATIONS

This is a continuation application of International Patent Application No. PCT/CN2021/120121, filed on Sep. 24, 2021, which claims priority to Chinese Patent Application No. 202110289168.9, filed on Mar. 18, 2021 and entitled "SEMICONDUCTOR STRUCTURE AND METHOD FOR FORMING SEMICONDUCTOR STRUCTURE". The disclosures of International Patent Application No. PCT/CN2021/120121 and Chinese Patent Application No. 202110289168.9 are incorporated by reference herein in their entireties.

TECHNICAL FIELD

The present disclosure relates to a semiconductor structure and a method for forming a semiconductor structure.

BACKGROUND

Dimensional uniformity is an important technical index of semiconductor manufacturing process. The improvement of dimensional uniformity plays an important role in improving process window and product yield. For example, the dimensional uniformity of capacitance holes in Dynamic Random Access Memory (DRAM) is particularly critical to the performance of the product. The dimensional uniformity of capacitance holes in the related art still needs to be improved.

SUMMARY

In a first aspect, the present disclosure provides a method for forming a semiconductor structure, which includes the following operations.

A base is provided.

A first dielectric layer is formed on the base.

A plurality of first mask patterns each having zigzag shape are formed on the first dielectric layer, in which the first mask patterns extend in a first direction.

A plurality of second mask patterns each having zigzag shape are formed on the first mask patterns, in which the second mask patterns extend in a second direction different from the first direction, and projections of the first mask patterns on the first dielectric layer and projections of the second mask patterns on the first dielectric layer overlap with each other to form polygons.

The first dielectric layer is etched by using the second mask patterns and the first mask patterns as masks to form openings.

In a second aspect, the present disclosure further provides a semiconductor structure, which includes:

a base;

a first dielectric layer arranged on the base;

a plurality of first mask patterns each having zigzag shape arranged on the first dielectric layer, the first mask patterns extending in a first direction; and a plurality of second mask patterns each having zigzag shape arranged on the first mask patterns, the second mask patterns extending in a second direction different from the first direction, and projections of the first mask patterns on the first dielectric layer and projections of the second mask patterns on the first dielectric layer overlap with each other to form polygons.

BRIEF DESCRIPTION OF THE DRAWINGS

One or more embodiments are exemplarily explained through the figures in the accompanying drawings corresponding thereto. Unless specifically declared, the figures in the accompanying drawings do not constitute a limitation of proportion.

DETAILED DESCRIPTION

The present disclosure provides a semiconductor structure and a method for forming a semiconductor structure. The method for forming the semiconductor structure includes the following operations. A base is provided. A first dielectric layer is formed on the base. A plurality of first mask patterns each having zigzag shape are formed on the first dielectric layer, in which the first mask patterns extend in a first direction. A plurality of second mask patterns each having zigzag shape are formed on the first mask patterns, in which the second mask patterns extend in a second direction different from the first direction, and projections of the first mask patterns on the first dielectric layer and projections of the second mask patterns on the first dielectric layer overlap with each other to form polygons. The first dielectric layer is etched by using the second mask patterns and the first mask patterns as masks to form openings. The polygonal shape is defined by the cooperation between the first mask patterns each having zigzag shape and the second mask patterns each having zigzag shape, and the openings are formed by etching the first dielectric layer by using the first mask patterns and the second mask patterns as masks, so that the etching uniformity problem caused by the etching load effect may be improved.

In order to make the foregoing objectives, features and advantages of the present disclosure more apparent and lucid, various embodiments of the present disclosure are described in detail below with reference to the accompanying drawings. When the embodiments of the present disclosure are described in detail, for the convenience of description, a schematic diagram may be partially enlarged not according to a general scale, and the schematic diagram is only an example, and should not limit the protection scope of the present disclosure herein. In addition, three-dimensional dimensions (length, width and depth) should be included in actual production.

Figure 1:
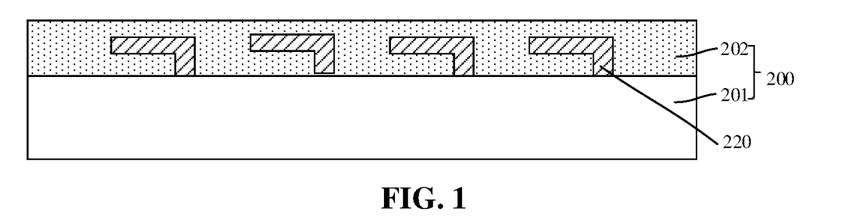
FIGS. 1-18 are schematic diagrams of a forming process of a semiconductor structure according to an embodiment of the present disclosure.

Referring to FIG. 1, a base 200 is provided.

The base 200 may be served as a platform for subsequent processes. In one embodiment, the base 200 includes a semiconductor substrate 201 and at least one interlayer dielectric layer 202 arranged on the semiconductor substrate 201. A connection pad 220 may be formed in the interlayer dielectric layer 202. The connection pad 220 may be subsequently configured to be connected to an electrode of a capacitor formed in a capacitance hole.

The material of the semiconductor substrate 201 may be silicon (Si), germanium (Ge), silicon germanium (GeSi), or silicon carbide (SiC); it may also be Silicon On Insulator (SOI), or Germanium On Insulator (GOI). Alternatively, it may be other materials, for example, group III-V compounds, such as gallium arsenide. The material of the semiconductor substrate 201 in this embodiment is silicon. The semiconductor substrate is doped with certain impurity ions as required, and the impurity ions may be N-type impurity ions or P-type impurity ions.

A plurality of trench type transistors may be formed in the semiconductor substrate 201, and each of the trench type transistors includes an active region. The active region is at least provided with one trench, and the active region is divided into a drain region and at least one source region by the trench. Specifically, when therein is one trench, the active region is divided into a source region and a drain region respectively arranged on both sides of the trench by the trench. When there are two trenches, the two trenches are parallel to each other, and the active region is divided into a drain region arranged between the two trenches and two source regions respectively arranged on the outside of the two trenches by the two trenches. A gate structure or word line (WL) is arranged in the trench. The drain region of the trench type transistor is subsequently connected to a bit line, and the source region of the trench type transistor is subsequently connected to the capacitor. The connection pad 220 formed in the interlayer dielectric layer is connected to the respective source region. Specifically, the connection pad 220 may be connected to the respective source region through a metal connection plug or a semiconductor connection plug.

The interlayer dielectric layer 202 may be a single layer or a multilayer (two or more layers) stacked structure. The material of the interlayer dielectric layer may be silicon nitride, silicon oxynitride, silicon oxide, fluorine-doped silicon dioxide (FSG), boron-doped silicon dioxide (BSG), phosphorus-doped silicon dioxide (PSG), or boron-phosphorus-doped silicon dioxide (BPSG), a low dielectric material, other suitable materials, and/or a combination thereof.

Figure 2:
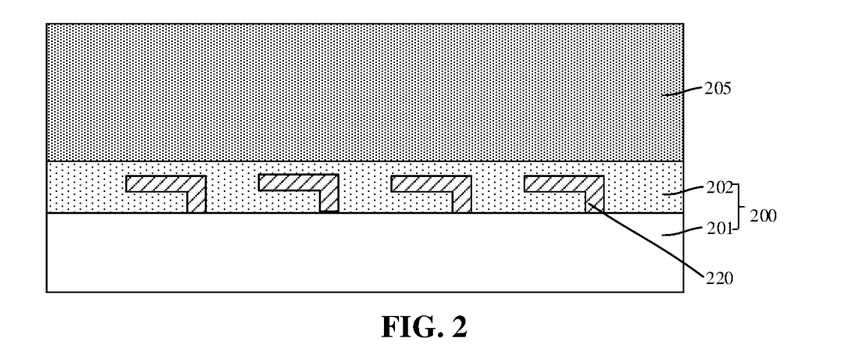

Referring to FIG. 2, a first dielectric layer 205 is formed on the base 200.

The first dielectric layer 205 may be configured to define and support a functional structure subsequently formed, such as a capacitance structure.

The first dielectric layer 205 may be a single layer or multilayer stacked structure.

In an embodiment, in a case that the first dielectric layer 205 is a single layer structure, the material of the first dielectric layer 205 may be any one of silicon oxide, silicon nitride, silicon oxynitride, silicon oxycarbide, or silicon carbide nitride.

In another embodiment, in a case that the first dielectric layer 205 is a multilayer stacked structure, the multilayer stacked structure may include several supporting layers and sacrificial layers alternately stacked onto one another. The material of the sacrificial layer is different from the material of the supporting layer. The material of the sacrificial layer may include any one of silicon oxide, silicon oxynitride, silicon oxycarbide, silicon carbide nitride, fluorine-doped silicon dioxide (FSG), boron-doped silicon dioxide (BSG), phosphorus-doped silicon dioxide (PSG), or boron-phosphorus-doped silicon dioxide (BPSG). The material of the supporting layer includes silicon nitride or doped silicon nitride, such as boron-doped or phosphorus-doped silicon nitride. For example, the first dielectric layer 205 includes a first supporting layer, a first sacrificial layer, a second supporting layer, a second sacrificial layer and a third supporting layer sequentially stacked onto one another on the base 200. The materials of the first sacrificial layer and the second sacrificial layer include any one of silicon oxide, silicon oxynitride, silicon oxycarbide, silicon carbide nitride, fluorine-doped silicon dioxide (FSG), boron-doped silicon dioxide (BSG), phosphorus-doped silicon dioxide (PSG), or boron-phosphorus-doped silicon dioxide (BPSG). The materials of the first supporting layer, the second supporting layer and the third supporting layer include silicon nitride or doped silicon nitride, such as boron-doped or phosphorus-doped silicon nitride. The materials of the first sacrificial layer and the second sacrificial layer may be the same or different, and the materials of the first supporting layer, the second supporting layer and the third supporting layer may be the same or different.

In one embodiment, the thickness of the first dielectric layer 205 is comprised between 500 nm and 3000 nm.

Figure 7:
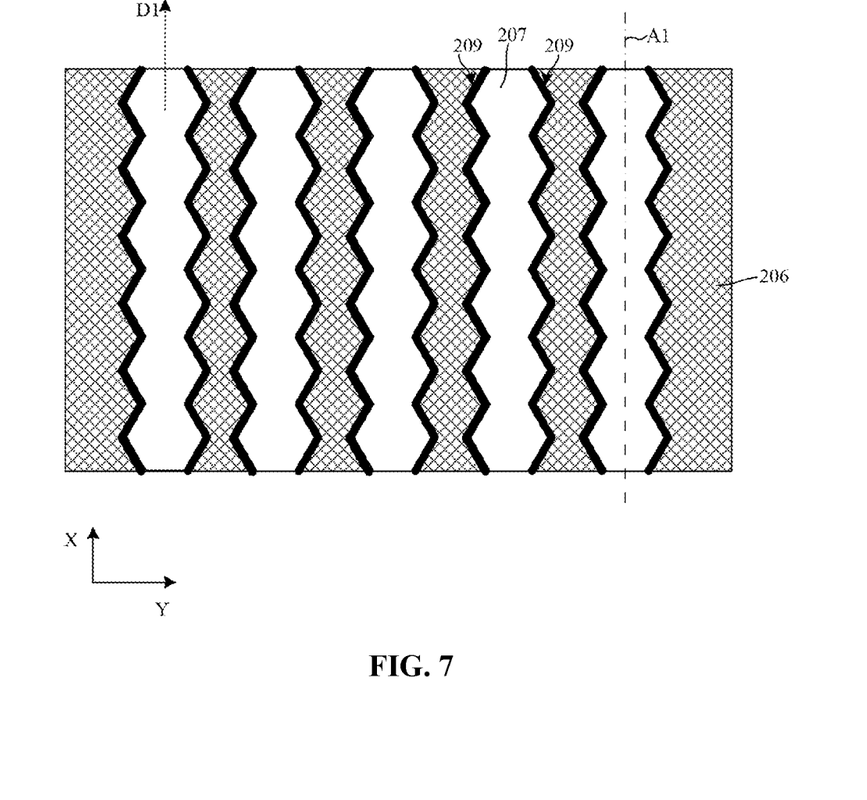
Figure 8:
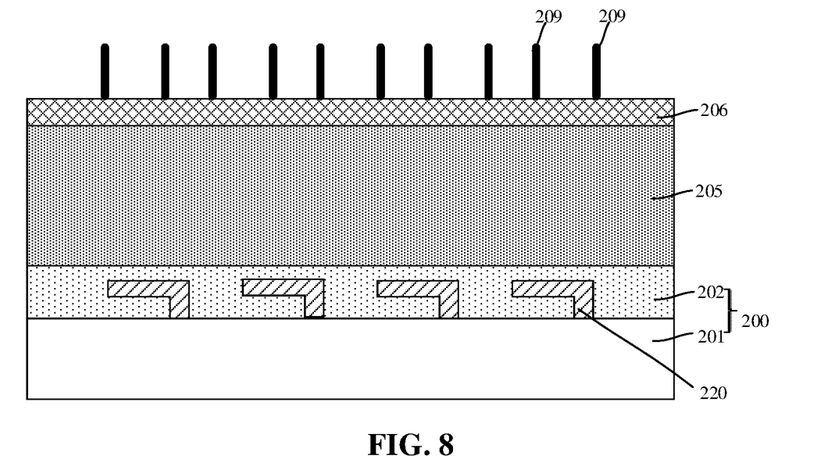

Referring to FIG. 7 and FIG. 8, after the first dielectric layer 205 is formed, a plurality of first mask patterns 209 each having zigzag shape are formed on the first dielectric layer 205. The first mask patterns 209 extend in the first direction D1. Specifically, the plurality of first mask patterns 209 extend along the first direction D1, and are arranged adjacent to each other on the first dielectric layer 205.

In one embodiment, as illustrated in FIG. 7, the zigzag shape of each first mask pattern 209 has sawteeth. Specifically, each sawtooth has a same angle, for example, 120°. Each sawtooth may also have a same length.

In one embodiment, each two adjacent first mask patterns 209 are axisymmetric patterns. As illustrated in FIG. 7, each two adjacent first mask patterns 209 are axially symmetrical about a first symmetry axis A1. The first symmetry axis A1 is located in the middle of the two adjacent first mask patterns 209 and parallel to the first direction D1.

A method for forming the first mask patterns is described in detail below with reference to a specific embodiment.

Figure 3:
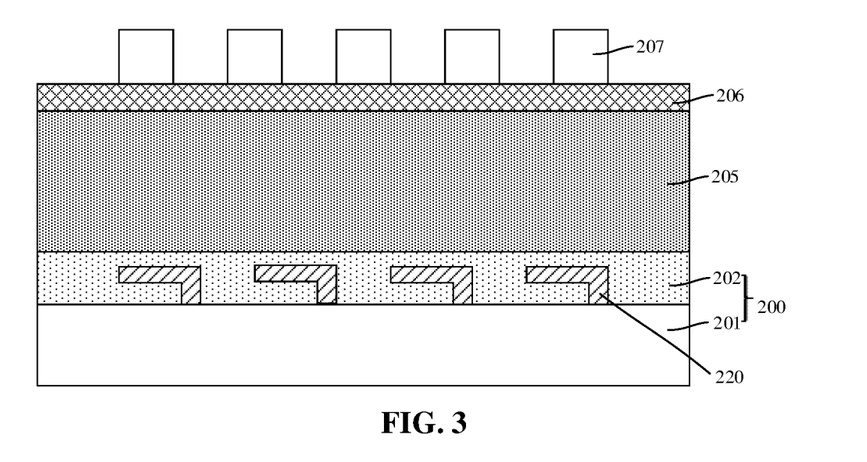
Figure 4:
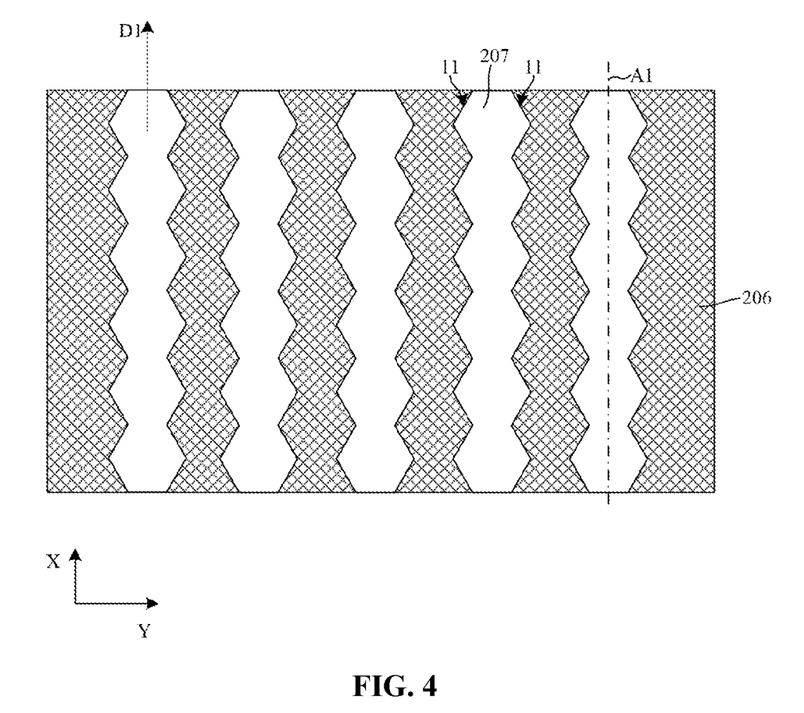

Referring to FIG. 3 and FIG. 4, FIG. 4 is a schematic top view of FIG. 3. A plurality of first sacrificial patterns 207, which are separated from each other and extend in the first direction D1, are formed on the first dielectric layer 205. Each first sacrificial pattern 207 includes sidewalls 11 each having zigzag shape on both sides of each first sacrificial pattern 207. Specifically, the plurality of first sacrificial patterns 207 extend in the first direction D1 and is arranged adjacent to each other. The adjacent first sacrificial patterns 207 may be arranged adjacent to each other in parallel at equal intervals, and each first sacrificial pattern 207 includes sidewalls 11 each having symmetrical zigzag shape on both sides of each first sacrificial pattern 207.

In one embodiment, the material of each first sacrificial pattern 207 may be a photoresist. Specifically, a photoresist is spin-coated on the first dielectric layer 205, and a photoresist pattern having zigzag shape is formed through exposure and development. In other examples, the material of each first sacrificial pattern 207 may be polysilicon, amorphous silicon, amorphous carbon, or the like. Specifically, a first mask sacrificial layer is formed on the first dielectric layer 205. A photoresist is spin-coated on the first mask sacrificial layer. A photoresist pattern having zigzag shape is formed through exposure and development. Then the first mask sacrificial layer is etched by using the photoresist pattern, so as to form the first sacrificial patterns 207. Specifically, a plurality of first sacrificial patterns 207 which are separated from each other and extend along the first direction D1 may be formed, and the distances between the centers of two adjacent first sacrificial patterns 207 may be equal to each other. In this embodiment, the first direction D1 is parallel to the direction of X-axis, and a plurality of first sacrificial patterns 207 separated from each other may be arranged at equal intervals in the direction of Y-axis.

The shapes of the sidewalls of the first sacrificial patterns 207 define the shapes of the first mask patterns subsequently formed. In this embodiment, the first sacrificial patterns 207 may include sidewalls 11 each having symmetrical zigzag shape. Specifically, each of the sidewalls 11 on both sides of each first sacrificial pattern 207 has zigzag shape, and the sidewalls 11 on both sides of each first sacrificial patterns 207 are axially symmetrical about the symmetry axis A1 (referring to FIG. 4).

In a specific embodiment, the zigzag shape of each of the sidewalls 11 of each first sacrificial pattern 207 has sawteeth. Each sawtooth has the same angle or the same length, or each sawtooth has the same angle and the same length. In this case, each first mask pattern subsequently formed also has zigzag shape, the zigzag shape of each first mask pattern also has sawteeth, and each sawtooth has the same angle or the same length, or each sawtooth has the same angle and the same length. For example, the angle of each sawtooth is 120°.

Referring to FIG. 5 to FIG. 8, first sidewall layers 208 are formed on the sidewalls and the top portions of the first sacrificial patterns 207 and on the first dielectric layer 205 between the adjacent first sacrificial patterns 207.

Figure 5:
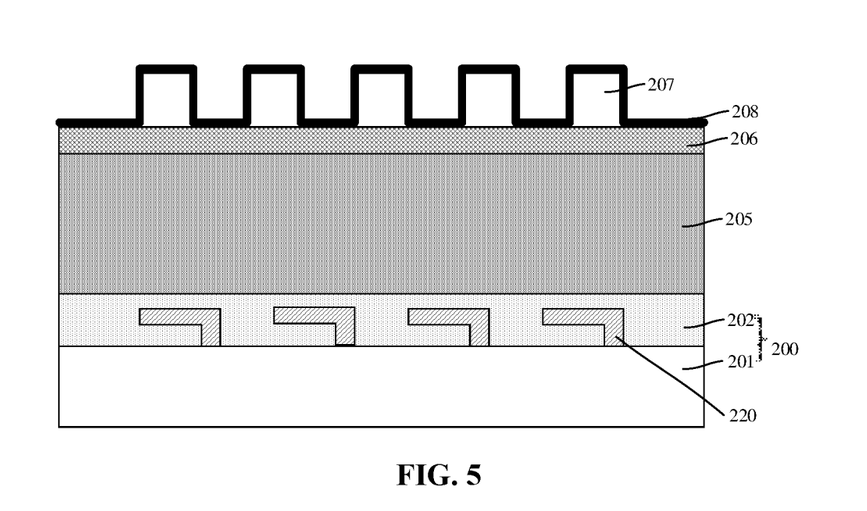

The first sidewall layers 208 are configured to subsequently form the first mask patterns. The material of the first sidewall layer 208 is different from the material of the first sacrificial pattern 207. Each first sidewall layer 208 has a higher etching selection ratio with respect to the first sacrificial patterns 207, so that the first sidewall layers 208 may be selectively etched through a dry etching process, thereby improving the accuracy of the positions and shapes of the formed first mask patterns 209. In addition, the first mask patterns 209 will not be excessively damaged during subsequent removal of the first sacrificial patterns 207.

In one embodiment, the material of the first sidewall layer 208 may be one of silicon oxide, silicon nitride, silicon oxynitride, silicon oxycarbide, or silicon carbide nitride. The first sidewall layers 208 may be formed through the PVD or ALD process. For example, the first sidewall layers 208 with thinner thickness, such as 1 Å-200 Å, may be formed through the ALD process.

In one embodiment, a first hard mask layer 206 is formed on the first dielectric layer 205. A portion of the first sidewall layers 208 are arranged on the surface of the first hard mask layer 206. Specifically, a first hard mask layer 206 is formed on the first dielectric layer 205, and the first sacrificial patterns 207 are arranged on the first hard mask layer 206.

In one embodiment, the first hard mask layer 206 is etched by using the first sidewall layers 208 remaining on the sidewalls of the first sacrificial patterns 207, so as to form the first mask patterns. Specifically, the first hard mask layer 206 arranged below the first sidewall layers 208 remaining on the sidewalls of the first sacrificial patterns 207 form the first mask patterns.

Figure 6:
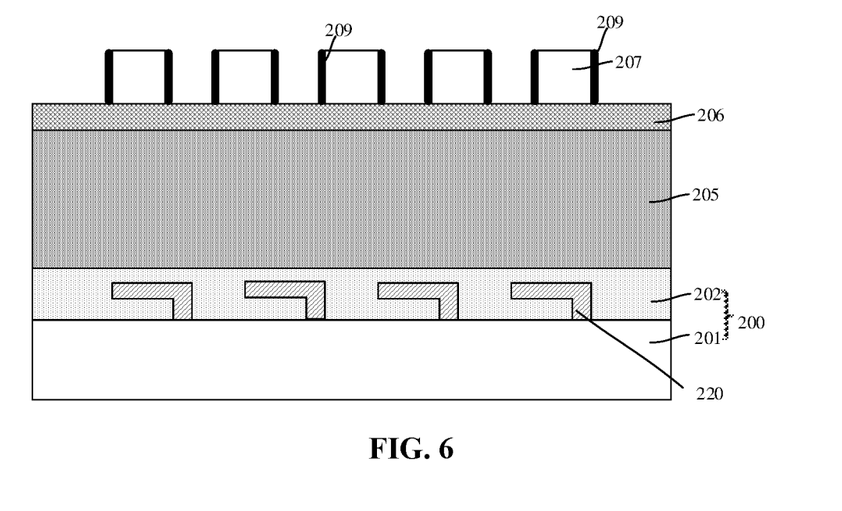

Referring to FIG. 6 and FIG. 7, the first sidewall layers 208 on the top portions of the first sacrificial patterns 207 and the first sidewall layers 208 between the adjacent first sacrificial patterns 207 are removed, so that the first sidewall layers 208 remaining on the sidewalls of the first sacrificial patterns 207 form the first mask patterns 209. Specifically, an anisotropic dry etching process may be used. The first sidewall layers 208 on the top portions of the first sacrificial patterns 207 and the first sidewall layers 208 between the adjacent first sacrificial patterns 207 are removed through the etching selection ratio of the first sacrificial pattern 207 to the first sidewall layer 208, so that the first sidewall layers 208 on the sidewalls of the first sacrificial patterns 207 are remained to form the first mask patterns 209.

In this embodiment, referring to FIG. 7, the zigzag shape of each formed first mask pattern 209 has sawteeth. Each sawtooth has the same angle or the same length, or each sawtooth has the same angle and the same length. For example, the angle of each sawtooth is 120°, and each two adjacent first mask patterns 209 among the plurality of first mask patterns 209 each having zigzag shape are axisymmetric patterns. Specifically, two adjacent first mask patterns 209 on the sidewalls of a single first sacrificial pattern 207 are axially symmetrical about the first symmetry axis A1. The first symmetry axis A1 is located in the middle of the two adjacent first mask patterns 209 and parallel to the first direction D1.

The dimensions of the first mask patterns 209 formed by the above-mentioned method are relatively small. For example, thinner first sidewall layers 208 may be conformally formed on the first sacrificial patterns 207 through the ALD process, and the second mask patterns with smaller dimensions may be subsequently formed on the first mask patterns through the same process, so that openings having thinner sidewall thickness and better dimensional uniformity may be formed when the first dielectric layer 205 is etched by using the first mask patterns 209 and the second mask patterns, thereby improving the density and quality of the openings.

Referring to FIG. 6 and FIG. 8, after the first mask patterns 209 are formed, the first sacrificial patterns 207 may be removed by a wet or dry process.

In one embodiment, in a case that the material of the first sacrificial pattern 207 is a photoresist, the first sacrificial patterns 207 may be removed through an ashing process.

In other embodiments, in a case that the material of the first sacrificial pattern 207 is a material other than the photoresist, subsequent operations of forming the second mask patterns may be directly performed without removing the first sacrificial patterns 207.

Figure 13:
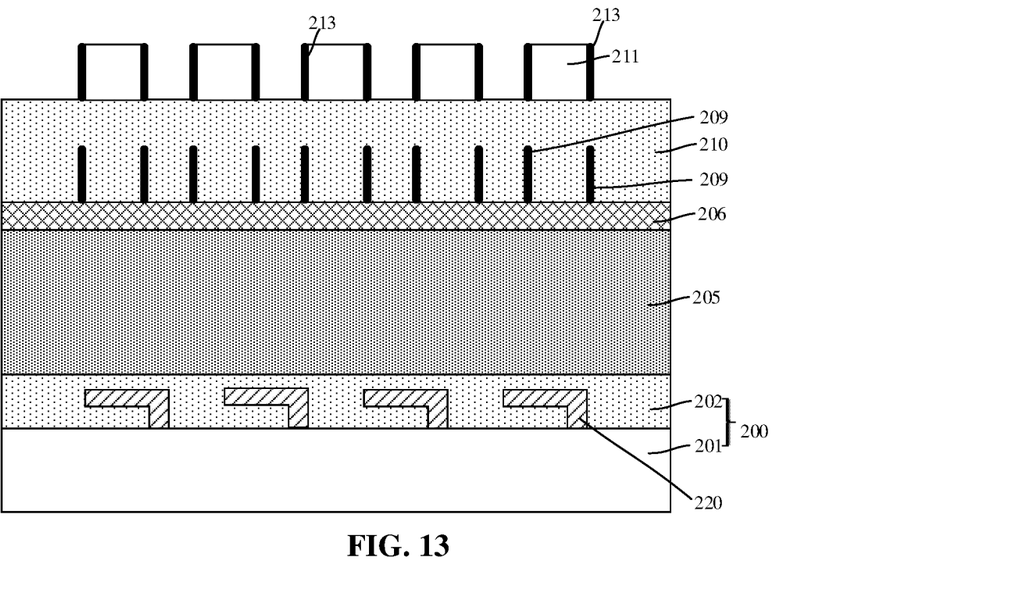
Figure 14:
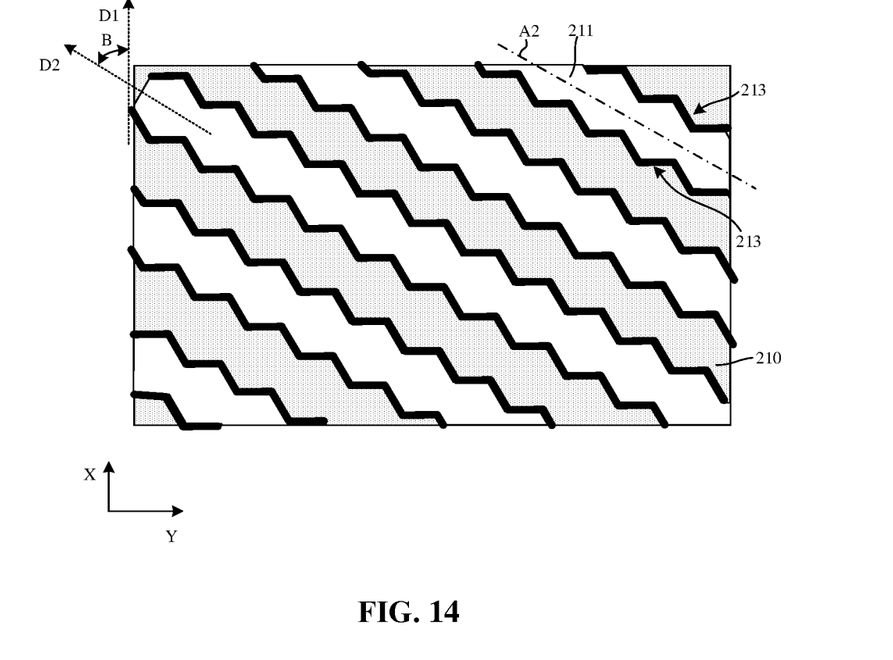

As illustrated in FIG. 13 and FIG. 14, after the first mask patterns 209 are formed, a plurality of second mask patterns 213 each having zigzag shape are formed on the first mask patterns 209. The plurality of second mask patterns 213 each having zigzag shape extend in the second direction D2 different from the first direction D1. The projections of the plurality of first mask patterns 209 each having zigzag shape on the first dielectric layer 205 and the projections of the plurality of second mask patterns 213 each having zigzag shape on the first dielectric layer 205 overlap with each other, so as to form polygons. A method for forming the second mask patterns is described in detail below with reference to a specific embodiment.

Figure 9:
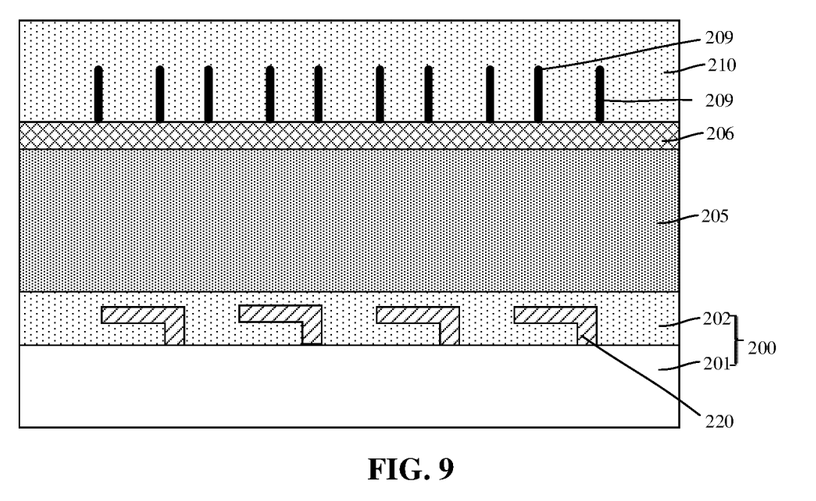

In one embodiment, referring to FIG. 9, before the second mask patterns are formed, a covering layer 210 is formed on the first mask patterns 209.

The covering layer 210 has a flat surface. The covering layer 210 may be a single layer or multilayer stacked structure. The second sacrificial patterns are subsequently formed on the covering layer 210.

In one embodiment, the covering layer 210 may include a first covering layer filling the gap between the first mask patterns 209, and a second covering layer arranged on the first covering layer. The second sacrificial patterns are subsequently formed on the second covering layer.

In one embodiment, a second hard mask layer may also be formed on the surface of the covering layer 210. The second sacrificial patterns are subsequently formed on the second hard mask layer.

The material of the covering layer 210 is different from the material of the first mask pattern 209. For example, the material of the covering layer 210 may contain carbon or silicon oxide.

Figure 10:
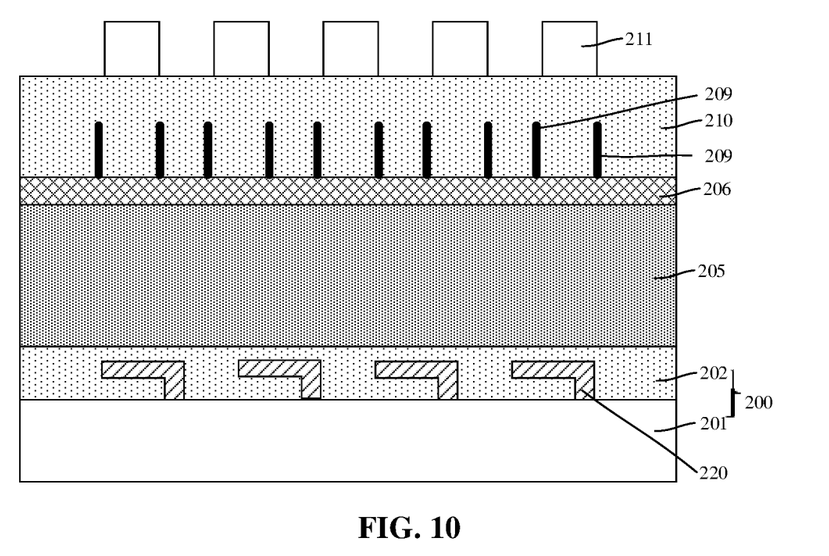
Figure 11:
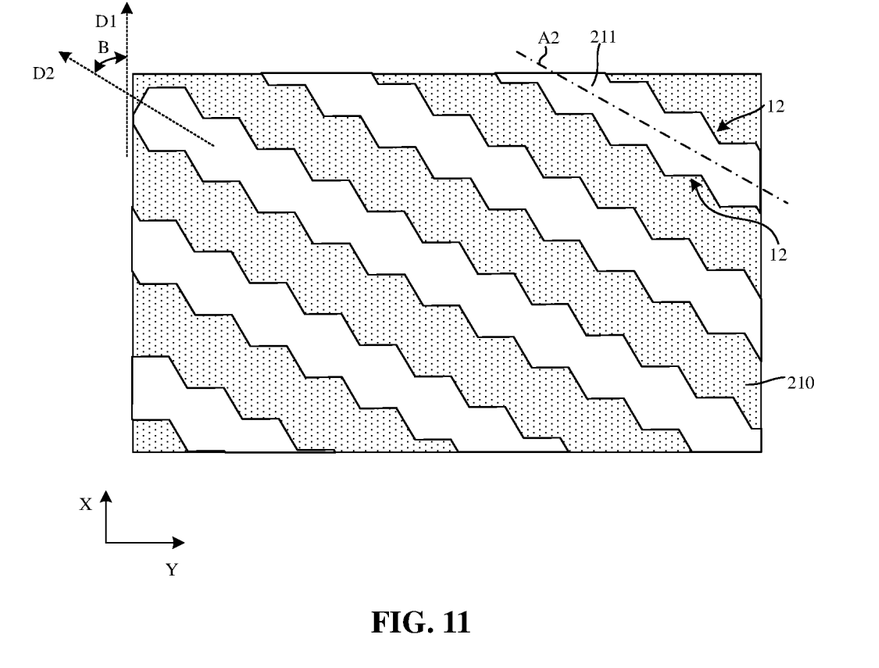

Referring to FIG. 10 and FIG. 11, a plurality of second sacrificial patterns 211, which are separated from each other and extend in the second direction D2, are formed on the covering layer 210. Each second sacrificial pattern 211 includes sidewalls 12 each having zigzag shape on both sides of each second sacrificial pattern 211. For example, each second sacrificial pattern 211 includes sidewalls 12 each having symmetrical zigzag shape on both sides of each second sacrificial pattern 211.

The material of the second sacrificial pattern 211 may be a photoresist or other suitable material (such as polysilicon, amorphous silicon, or amorphous carbon). A plurality of second sacrificial patterns 211 separated from each other may be formed through exposure and development processes, or through exposure, development, and etching processes. The plurality of second sacrificial patterns 211 separated from each other extend parallel to the second direction D2, and the distances between the centers of two adjacent second sacrificial patterns 211 are equal to each other. In this embodiment, an angle B between the second direction D2 and the first direction D1 is 60°.

The shapes of the sidewalls of the second sacrificial patterns 211 define the shapes of second mask patterns subsequently formed. In this embodiment, the second sacrificial patterns 211 include sidewalls 12 each having symmetrical zigzag shape. Specifically, each of the sidewalls 12 on both sides of each second sacrificial pattern 211 has zigzag shape, and the sidewalls 12 on both sides of each second sacrificial patterns 211 are axially symmetrical about the symmetry axis A2 (referring to FIG. 11)

In a specific embodiment, the zigzag shape of each of the sidewalls 12 of each second sacrificial pattern 211 has sawteeth. Each sawtooth has the same angle or the same length, or each sawtooth has the same angle and the same length. In this case, each second mask pattern subsequently formed also has zigzag shape, the zigzag shape of each second mask pattern also has sawteeth, and each sawtooth has the same angle or the same length, or each sawtooth has the same angle and the same length. For example, the angle of each sawtooth is 120°.

Figure 12:
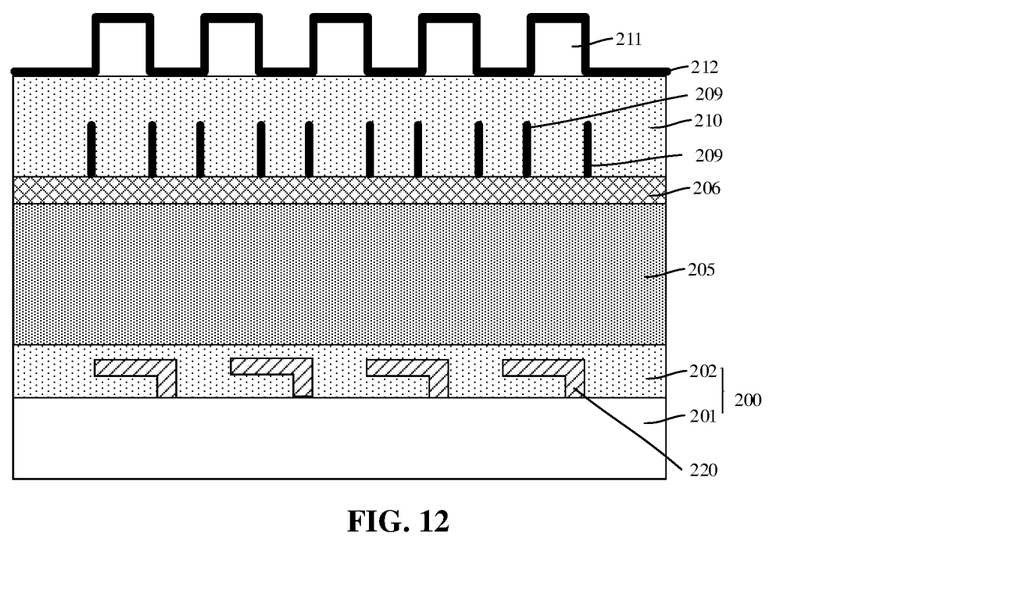

Referring to FIG. 12 and FIG. 13, second sidewall layers 212 are formed on the sidewalls and the top portions of the second sacrificial patterns 211 and on the covering layer 210 between the adjacent second sacrificial patterns 211.

The second sidewall layers 212 are configured to subsequently form the second mask patterns. The material of the second sidewall layer 212 is different from the material of the second sacrificial pattern 211. Each second sidewall layer 212 has a higher etching selection ratio with respect to the second sacrificial patterns 211, so that the second sidewall layers 212 may be selectively etched through a dry etching process, thereby improving the accuracy of the positions and shapes of the formed second mask patterns 213. In addition, the second mask patterns 213 will not be excessively damaged during subsequent removal of the second sacrificial patterns 211.

In one embodiment, the material of the second sidewall layer 212 may be any one of silicon oxide, silicon nitride, silicon oxynitride, silicon oxycarbide, or silicon carbide nitride. The second sidewall layers 212 are formed through the CVD or ALD process. For example, the second sidewall layers 212 with thinner thickness, such as 1 Å-200 Å, may be formed through the ALD process.

In one embodiment, in a case that a second hard mask layer is formed on the covering layer 210, a portion of the second sidewall layers 212 are arranged on the surface of the second hard mask layer.

Referring to FIG. 13 and FIG. 14, the second sidewall layers 212 on the top portions of the second sacrificial patterns 211 and on the covering layer 210 are removed, so that the second sidewall layers 212 remaining on the sidewalls of the second sacrificial patterns 211 form the second mask patterns 213.

The second sidewall layers 212 on the top portions of the second sacrificial patterns 211 and on the covering layer 210 may be removed by using an anisotropic dry etching process, so that the second sidewall layers 212 on the sidewalls of the second sacrificial patterns 211 are remained to form second mask patterns 213.

Each formed second mask pattern 213 has zigzag shape. The zigzag shape of each second mask pattern has sawteeth. Each sawtooth has the same angle or the same length, or each sawtooth has the same angle and the same length. The angle of each sawtooth is 120°, and each two adjacent second mask patterns 213 among the plurality of second mask patterns 213 each having zigzag shape are axisymmetric patterns. Specifically, two adjacent second mask patterns 213 among the plurality of second mask patterns 213 each having zigzag shape are axially symmetrical about the second symmetry axis A2. The second symmetry axis A2 is located in the middle of the two adjacent second mask patterns 213 and parallel to the second direction D2. The projection of an edge of each sawtooth in each second mask pattern 213 on the first dielectric layer coincides with the projection of an edge of a respective sawtooth in each first mask pattern 209 on the first dielectric layer, so that the projection 209T of the plurality of first mask patterns 209 each having zigzag shape on the first dielectric layer and the projection 213T of the plurality of second mask patterns 213 each having zigzag shape on the first dielectric layer overlap with each other, so as to form a plurality of regular hexagons 13 arranged in a honeycomb shape (referring to FIG. 15). The openings subsequently formed by etching the first dielectric layer 205 through the first mask patterns 209 and the second mask patterns 213 are also arranged in a honeycomb shape.

Figure 16:
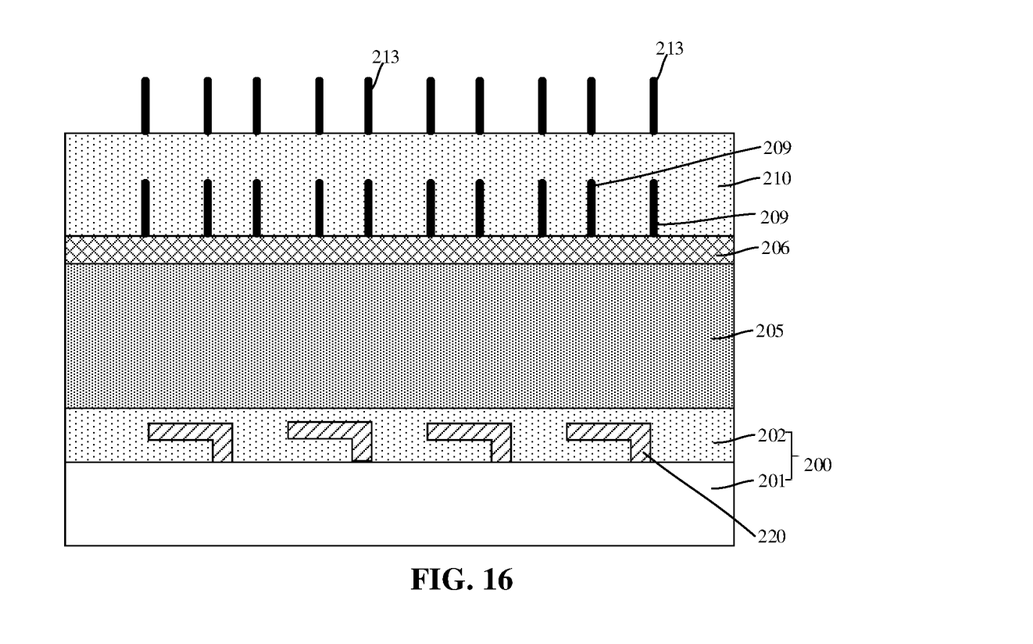

Referring to FIG. 16, after the second mask patterns 213 are formed, the second sacrificial patterns 211 are removed. The second sacrificial patterns 211 may be removed through wet etching or dry etching.

In one embodiment, in a case that the material of the second sacrificial pattern 211 is a photoresist, the second sacrificial patterns 211 may be removed through an ashing process.

Figure 17:
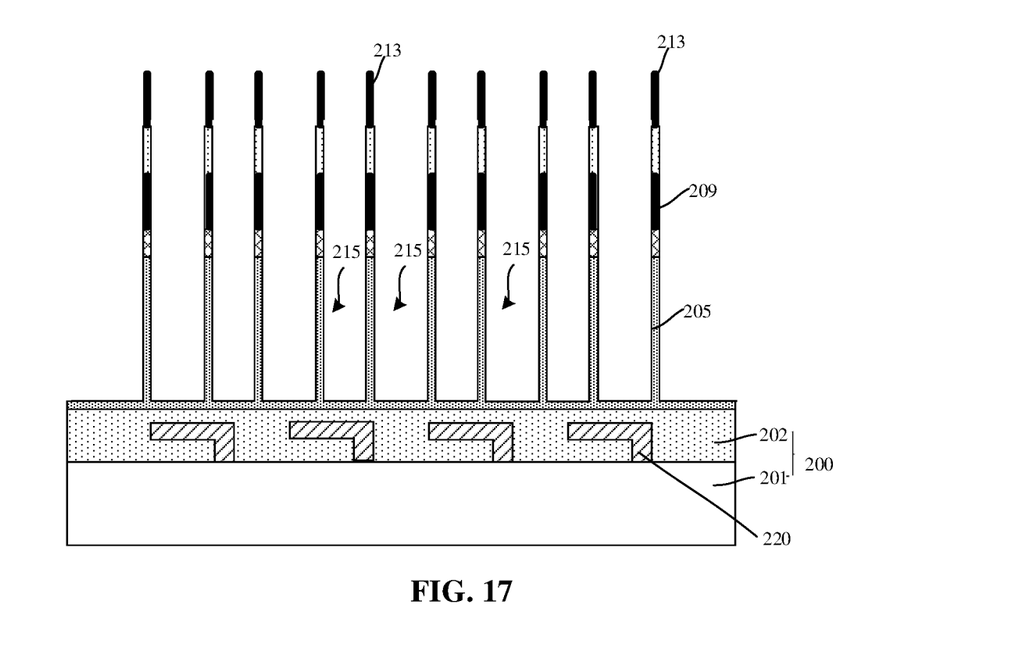
Figure 18:
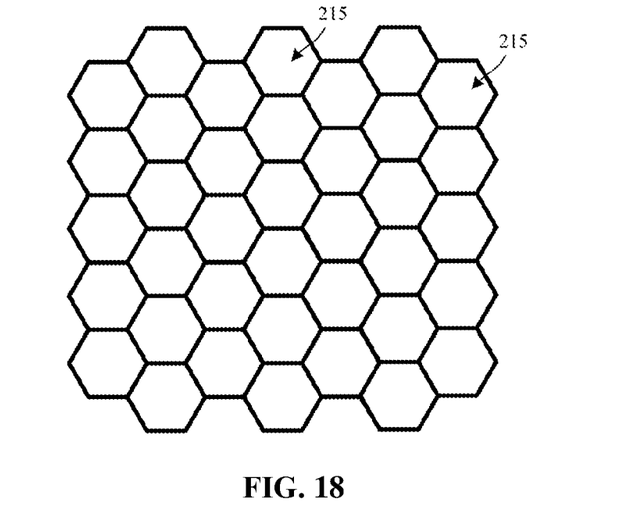

Referring to FIG. 17 and FIG. 18, the first dielectric layer 205 is etched by using a plurality of second mask patterns 213 each having zigzag shape and a plurality of first mask patterns 209 each having zigzag shape as masks, so as to form a plurality of openings 215 in the first dielectric layer 205. Specifically, the openings may be capacitance holes.

The first dielectric layer 205 may be etched by using an anisotropic dry etching process. In one embodiment, the gases used for etching the first dielectric layer 205 include one or more of CF4, C4F8, and CHF3.

In this embodiment, the openings 215 are formed in a regular hexagonal shape, and a plurality of regular hexagonal openings 215 are arranged in a honeycomb shape (referring to FIG. 18). The shape of the regular hexagon is defined by the first mask patterns and the second mask patterns in an above-mentioned specific shape. In the process of etching the first dielectric layer to form the regular hexagonal openings 215, since the angle and the side length of the regular hexagon in six directions are the same, the load effect during etching may be better prevented, so that the formed openings 215 have better dimensional uniformity, thereby facilitating the improvement of the production yield and performance of chip. In addition, the dimensions of the first mask patterns and the second mask patterns may be made smaller, so that the thickness of the sidewalls of the openings 215 in a regular hexagonal shape may be thinner, thereby increasing the density of the openings 215 formed per unit area.

Figure 19:
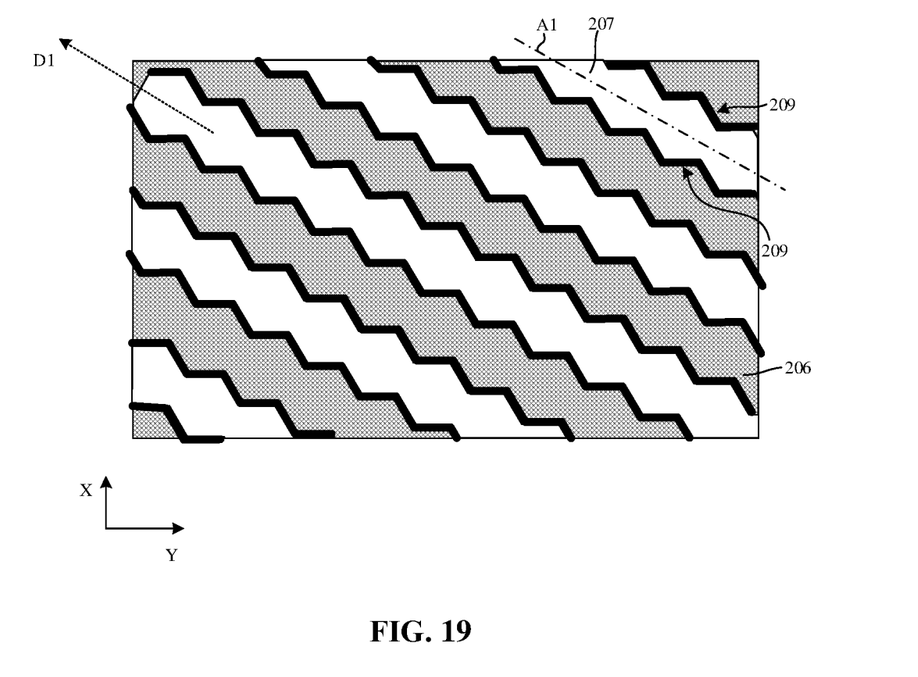
FIGS. 19-21 are schematic diagram of a forming process of a semiconductor structure according to another embodiment of the present disclosure.
Figure 20:
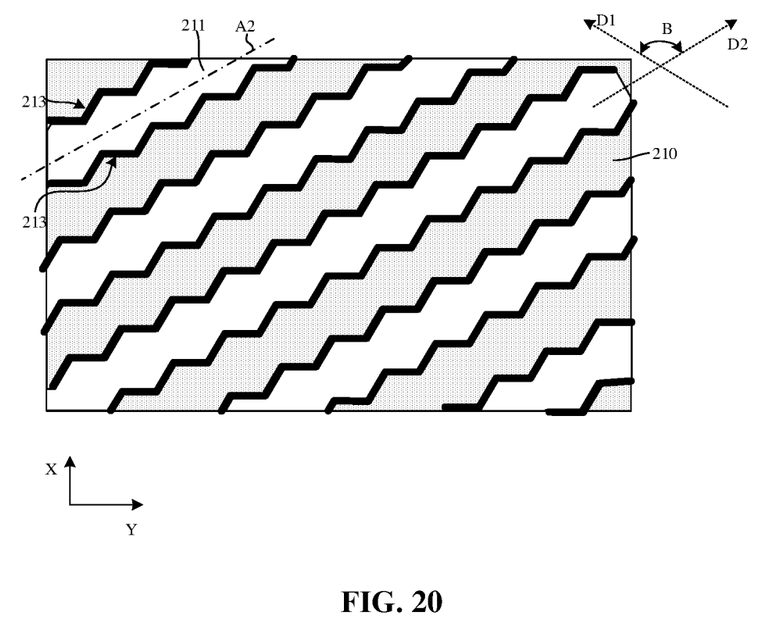
Figure 21:
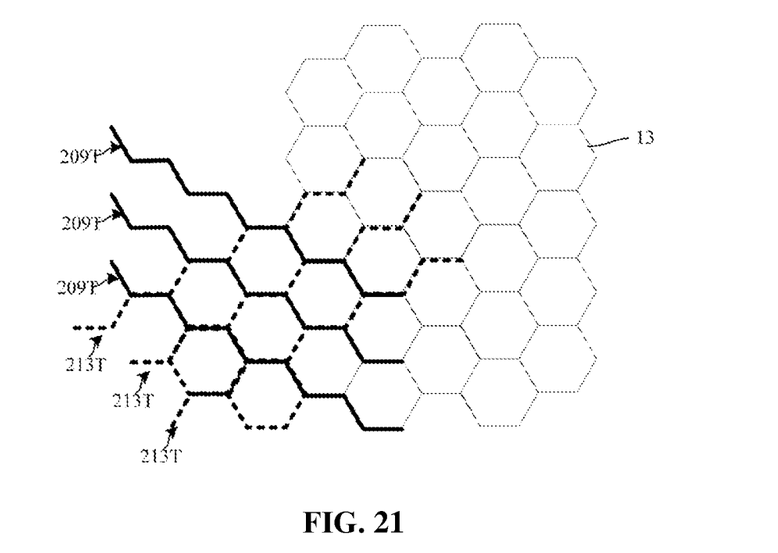

Another embodiment of the present disclosure further provides a method for forming a semiconductor structure. The only difference between this embodiment and the above-mentioned embodiment is that, the specific value of the angle B between the extending direction of each first mask pattern and the extending direction of each second mask pattern is different from the specific value of the angles B between the extending direction of each first mask pattern and the extending direction of each second mask pattern in the above-mentioned embodiment. Other definitions and descriptions are the same as those in the above-mentioned embodiment, which are not repeated herein. The detail description may refer to FIG. 19 to FIG. 21. Referring to FIG. 19, the first mask patterns 209 extend along the first direction D1. Referring to FIG. 20, the second mask patterns 213 extend along the second direction D2. The angle between the first direction D1 and the second direction D2 is 120°. Referring to FIG. 21, projections 209T of a plurality of first mask patterns 209 each having zigzag shape on the first dielectric layer and the projections 213T of a plurality of second mask patterns 213 each having zigzag shape on the first dielectric layer overlap with each other, so as to form a plurality of regular hexagons 13 arranged in a honeycomb shape.

The present disclosure further provides a semiconductor structure. Referring to FIG. 13 to FIG. 15 and FIG. 7, the semiconductor structure includes:
  a base 200;
  a first dielectric layer 205 arranged on the base 200;
  a plurality of first mask patterns 209 each having zigzag shape arranged on the first dielectric layer 205, the first mask patterns 209 extending in a first direction D1; and
  a plurality of second mask patterns 213 each having zigzag shape arranged on the first mask patterns 209, the second mask patterns extending in a second direction D2 different from the first direction D1, and projections of the first mask patterns 209 on the first dielectric layer and projections of the second mask patterns 213 on the first dielectric layer overlap with each other to form polygons.

In one embodiment, the zigzag shape of each first mask pattern 209 and the zigzag shape of each second mask patterns 213 have sawteeth.

In one embodiment, each sawtooth has a same angle or a same length, or each sawtooth has the same angle and the same length. For example, the angle of each sawtooth may be 120°.

In one embodiment, each two adjacent first mask patterns 209 are axisymmetric patterns, or each two adjacent second mask patterns 213 are axisymmetric patterns. Specifically, two adjacent first mask patterns 209 among the plurality of first mask patterns 209 each having zigzag shape are axially symmetrical about a first symmetry axis A1. The first symmetry axis A1 is located in the middle of the two adjacent first mask patterns 209 and parallel to the first direction D1 (referring to FIG. 7). Two adjacent second mask patterns 213 among the plurality of second mask patterns 213 each having zigzag shape are axially symmetrical about a second symmetry axis A2. The second symmetry axis A2 is located in the middle of the two adjacent second mask patterns and parallel to the second direction D2 (referring to FIG. 14).

Figure 15:
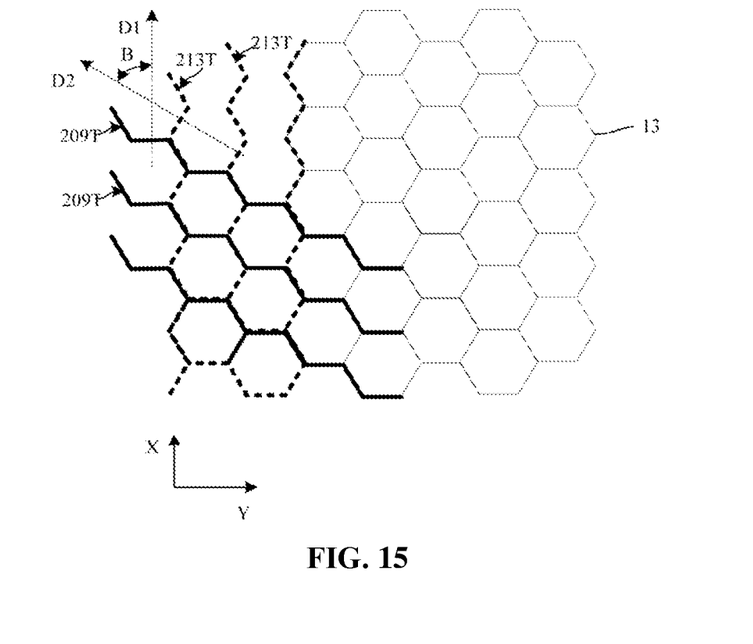

In one embodiment, the angle between the first direction D1 and the second direction D2 is 60° or 120°, and each polygon is a regular hexagon.

In one embodiment, a projection of an edge of each sawtooth in each second mask pattern 213 on the first dielectric layer 205 coincides with a projection of an edge of a respective sawtooth in each first mask pattern 209 on the first dielectric layer 205.

Although some preferred embodiments are disclosed as above, it is not intended to limit the present disclosure. Any person skilled in the art may implement any possible changes or modifications to the technical solutions of the present disclosure by using the methods and technical contents disclosed above, without departing from the spirit and scope of the present disclosure. Therefore, any simple changes, equivalent changes and modifications to the above embodiments according to the technical essence of the present disclosure which does not depart from the technical solutions of the present disclosure will fall within the protection scope of the technical solutions of the present disclosure.

The invention claimed is:

1. A method for forming a semiconductor structure, comprising:
  providing a base;
  forming a first dielectric layer on the base;
  forming a plurality of first mask patterns each having zigzag shape on the first dielectric layer, wherein the first mask patterns extend in a first direction;
  forming a plurality of second mask patterns each having zigzag shape on the first mask patterns, wherein the second mask patterns extend in a second direction different from the first direction, wherein an angle between the first direction and the second direction is 60° or 120°, and projections of the first mask patterns on the first dielectric layer and projections of the second mask patterns on the first dielectric layer overlap with each other to form a plurality of regular hexagons; and
  etching the first dielectric layer by using the second mask patterns and the first mask patterns as masks to form openings.

2. The method for forming the semiconductor structure according to claim 1, wherein the zigzag shape of each first mask pattern and the zigzag shape of each second mask pattern have sawteeth.

3. The method for forming the semiconductor structure according to claim 2, wherein each sawtooth has a same angle and a same length.

4. The method for forming the semiconductor structure according to claim 2, wherein each sawtooth has a same angle.

5. The method for forming the semiconductor structure according to claim 2, wherein each sawtooth has a same length.

6. The method for forming the semiconductor structure according to claim 3, wherein the angle of each sawtooth is 120°.

7. The method for forming the semiconductor structure according to claim 3, wherein each two adjacent first mask patterns are axisymmetric patterns, or each two adjacent second mask patterns are axisymmetric patterns.

8. The method for forming the semiconductor structure according to claim 1, wherein forming the plurality of first mask patterns comprises:

forming a plurality of first sacrificial patterns, which are separated from each other and extend in the first direction, on the first dielectric layer, wherein each first sacrificial pattern comprises sidewalls each having zigzag shape on both sides of each first sacrificial pattern;

forming first sidewall layers on the sidewalls and top portions of the first sacrificial patterns and on the first dielectric layer between adjacent first sacrificial patterns; and removing the first sidewall layers on the top portions of the first sacrificial patterns and the first sidewall layers between the adjacent first sacrificial patterns, wherein the first sidewall layers remaining on the sidewalls of the first sacrificial patterns form the first mask patterns.

9. The method for forming the semiconductor structure according to claim 8, further comprising:

forming a first hard mask layer on the first dielectric layer, wherein the first sacrificial patterns are arranged on the first hard mask layer; and etching the first hard mask layer by using the first sidewall layers remaining on the sidewalls of the first sacrificial patterns to form the first mask patterns.

10. The method for forming the semiconductor structure according to claim 2, wherein a projection of an edge of each sawtooth in each second mask pattern on the first dielectric layer coincides with a projection of an edge of a respective sawtooth in each first mask pattern on the first dielectric layer.

11. The method for forming the semiconductor structure according to claim 8, wherein forming the plurality of second mask patterns comprises:

forming a covering layer on the first mask patterns;

forming a plurality of second sacrificial patterns, which are separated from each other and extend in the second direction, on the covering layer, wherein each second sacrificial pattern comprises sidewalls each having zigzag shape on both sides of each second sacrificial pattern;

forming second sidewall layers on the sidewalls and top portions of the second sacrificial patterns and on the covering layer between adjacent second sacrificial patterns; and removing the second sidewall layers on the top portions of the second sacrificial patterns and the second sidewall layers on the covering layer, wherein the second mask patterns remaining on the sidewalls of the second sacrificial patterns form the second mask patterns.

12. The method for forming the semiconductor structure according to claim 11, wherein a material of each first sacrificial pattern or each second sacrificial pattern is a photoresist.

13. A semiconductor structure, comprising:

a base;

a first dielectric layer arranged on the base;

a plurality of first mask patterns each having zigzag shape arranged on the first dielectric layer, the first mask patterns extending in a first direction; and a plurality of second mask patterns each having zigzag shape arranged on the first mask patterns, the second mask patterns extending in a second direction different from the first direction, wherein an angle between the first direction and the second direction is 60° or 120°, and projections of the first mask patterns on the first dielectric layer and projections of the second mask patterns on the first dielectric layer overlap with each other to form a plurality of regular hexagons.

14. The semiconductor structure according to claim 13, wherein the zigzag shape of each first mask pattern and the zigzag shape of each second mask pattern have sawteeth.

15. The semiconductor structure according to claim 14, wherein each sawtooth has a same angle and a same length.

16. The semiconductor structure according to claim 14, wherein each sawtooth has a same angle or a same length.

17. The semiconductor structure according to claim 15, wherein the angle of each sawtooth is 120°.

18. The semiconductor structure according to claim 14, wherein a projection of an edge of each sawtooth in each second mask pattern on the first dielectric layer coincides with a projection of an edge of a respective sawtooth in each first mask pattern on the first dielectric layer.

\* \* \* \* \*